(12) United States Patent
Chen et al.

(10) Patent No.: US 11,086,205 B2
(45) Date of Patent: Aug. 10, 2021

(54) LIGHT SOURCE DEVICE AND PROJECTION APPARATUS

(71) Applicant: Coretronic Corporation, Hsin-Chu (TW)

(72) Inventors: Chang-Hsuan Chen, Hsin-Chu (TW); Chien-Chung Liao, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 140 days.

(21) Appl. No.: 16/581,771

(22) Filed: Sep. 25, 2019

(65) Prior Publication Data

US 2020/0096853 A1    Mar. 26, 2020

(30) Foreign Application Priority Data

Sep. 25, 2018   (CN) .......................... 201821557901.0

(51) Int. Cl.
| | |
|---|---|
| *G03B 21/14* | (2006.01) |
| *G03B 21/20* | (2006.01) |
| *G02B 19/00* | (2006.01) |
| *H01S 5/00* | (2006.01) |
| *F21K 9/68* | (2016.01) |
| *G03B 21/28* | (2006.01) |

(52) U.S. Cl.
CPC ..... *G03B 21/2013* (2013.01); *G02B 19/0052* (2013.01); *G03B 21/2033* (2013.01); *H01S 5/0087* (2021.01); *F21K 9/68* (2016.08); *G03B 21/28* (2013.01); *H01S 5/005* (2013.01)

(58) Field of Classification Search
CPC .... G03B 21/14; G03B 21/2033; G03B 21/28; G03B 21/2006; G03B 21/2013; G03B 21/204; G03B 21/2066; G02B 19/0052; F21V 7/0083
USPC ........................ 362/241, 249; 353/94, 98, 99
See application file for complete search history.

(56) References Cited

U.S. PATENT DOCUMENTS

| | | | |
|---|---|---|---|
| 5,838,247 | A  | 11/1998 | Bladowski |
| 2010/0072900 | A1 | 3/2010  | Deppe |
| 2012/0320355 | A1 | 12/2012 | Maeda |
| 2013/0100974 | A1 | 4/2013  | Janssens et al. |
| 2015/0181179 | A1 | 6/2015  | Yamamoto et al. |
| 2015/0323861 | A1 | 11/2015 | Saitou |

(Continued)

FOREIGN PATENT DOCUMENTS

| | | |
|---|---|---|
| CN | 102722077 A | 10/2012 |
| CN | 102841494 A | 12/2012 |

(Continued)

*Primary Examiner* — William C. Dowling

(57) ABSTRACT

A light source device has a first light source assembly. The first light source assembly has plural first light source sets. The first light source sets are arranged around a first central axis. Each of the first light source sets has a first excitation light source and a first reflecting element. The first reflecting element is disposed between the first excitation light source and the first central axis to reflect a first excitation light of the corresponding first excitation light source, and thereby forming a laser beam. A projection apparatus has an illumination system, an optical engine, and a projection lens. The illumination system has a light source device and a wavelength-converting wheel. The light source device and the illumination system may improve the utilization efficiency of the condenser lens.

16 Claims, 12 Drawing Sheets

(56) References Cited

U.S. PATENT DOCUMENTS

2016/0363273 A1* 12/2016 Piehler .................... F21V 5/04
2020/0096853 A1* 3/2020 Chen ................. G02B 19/0052

FOREIGN PATENT DOCUMENTS

| | | | |
|---|---|---|---|
| CN | 103176340 | A | 6/2013 |
| CN | 103322471 | A | 9/2013 |
| CN | 105467736 | A | 4/2016 |
| CN | 106249527 | A | 12/2016 |
| CN | 207541400 | U | 6/2018 |
| CN | 209525552 | U | 10/2019 |
| EP | 1826474 | A1 | 8/2007 |
| JP | 2003347595 | A | 12/2003 |
| TW | 200916824 | A | 4/2009 |
| TW | I451130 | B | 9/2014 |

\* cited by examiner 112 111
110

LIGHT SOURCE DEVICE AND PROJECTION APPARATUS

CROSS-REFERENCE TO RELATED APPLICATION

This application claims the priority benefit of China application CN201821557901.0, filed on Sep. 25, 2018. The entirety of the above-mentioned patent application is hereby incorporated by reference herein and made a part of this specification.

FIELD OF THE INVENTION

The invention relates to a light source device and a projection apparatus.

BACKGROUND OF THE INVENTION

At present, a laser projection apparatus has a projection lens, an optical engine, and a light source device. The light source device is used for light-collecting, spectrum conversion, real-time color segmentation. The light engine is used for color light filtering, color light homogenizing, and grayscale generating. The projection lens is used for image projection. To improve the efficiency in light collecting, the blue laser lights are condensed into a small light spot. Before light condensing, the blue laser sources are arranged in an array on a plane, and then the blue laser lights are mixed by a light combiner, so as to achieve the laser light collecting effect.

However, the blue laser lights emitted from the arranged laser sources pass through the light combiner and form light spots on a condenser lens. The light spots are mainly distributed on the center portion of the condenser lens. The peripheral portion of the condenser lens is mostly unused. Therefore, the condenser lens disposed in the light source device is not utilized efficiently.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a light source device and a projection apparatus, which can improve utilization efficiency of condenser lens.

Other advantages and objects of the invention may be further illustrated by the technical features broadly embodied and described as follows.

In order to achieve one or a portion of or all of the objects or other objects, an embodiment of the invention provides a light source device. The light source device includes a first light source assembly. The first light source assembly includes a plurality of first light source sets. The first light source sets are arranged around a first central axis. Each of the first light source sets includes a first excitation light source and a first reflecting element. The first reflecting element is disposed between the first excitation light source and the first central axis, and a first excitation light of the first excitation light source is reflected by the first reflecting element, so as to form a laser beam.

In order to achieve one or a portion of or all of the objects or other objects, an embodiment of the invention provides a projection apparatus. The projection apparatus includes an illumination system, an optical engine, and a projection lens. The illumination system is configured to provide an illuminating beam. The optical engine is disposed on a transmission path of the illuminating beam and converts the illuminating beam into an image beam. The projection lens is disposed on a transmission path of the image beam. The illumination system includes the light source device above and a wavelength-converting wheel. The wavelength-converting wheel is disposed on a transmission path of the laser beam and converts the laser beam into a conversion beam. The illuminating beam includes the conversion beam.

In the light source device and the projection apparatus of the invention, since the first light source sets of the first light source assembly are arranged around the first central axis, and the first reflecting element is disposed between the first excitation light source and the first central axis, the first reflecting lights formed by reflecting the first excitation lights of the first excitation light sources of the first light source assembly by the first reflecting elements may form circularly-distributed light spots on the peripheral portion of the condensing lens. Accordingly, the peripheral portion of the condensing lens is utilized, and the advantage of improving the utilization efficiency of the condensing lens is achieved.

Other objectives, features and advantages of the invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
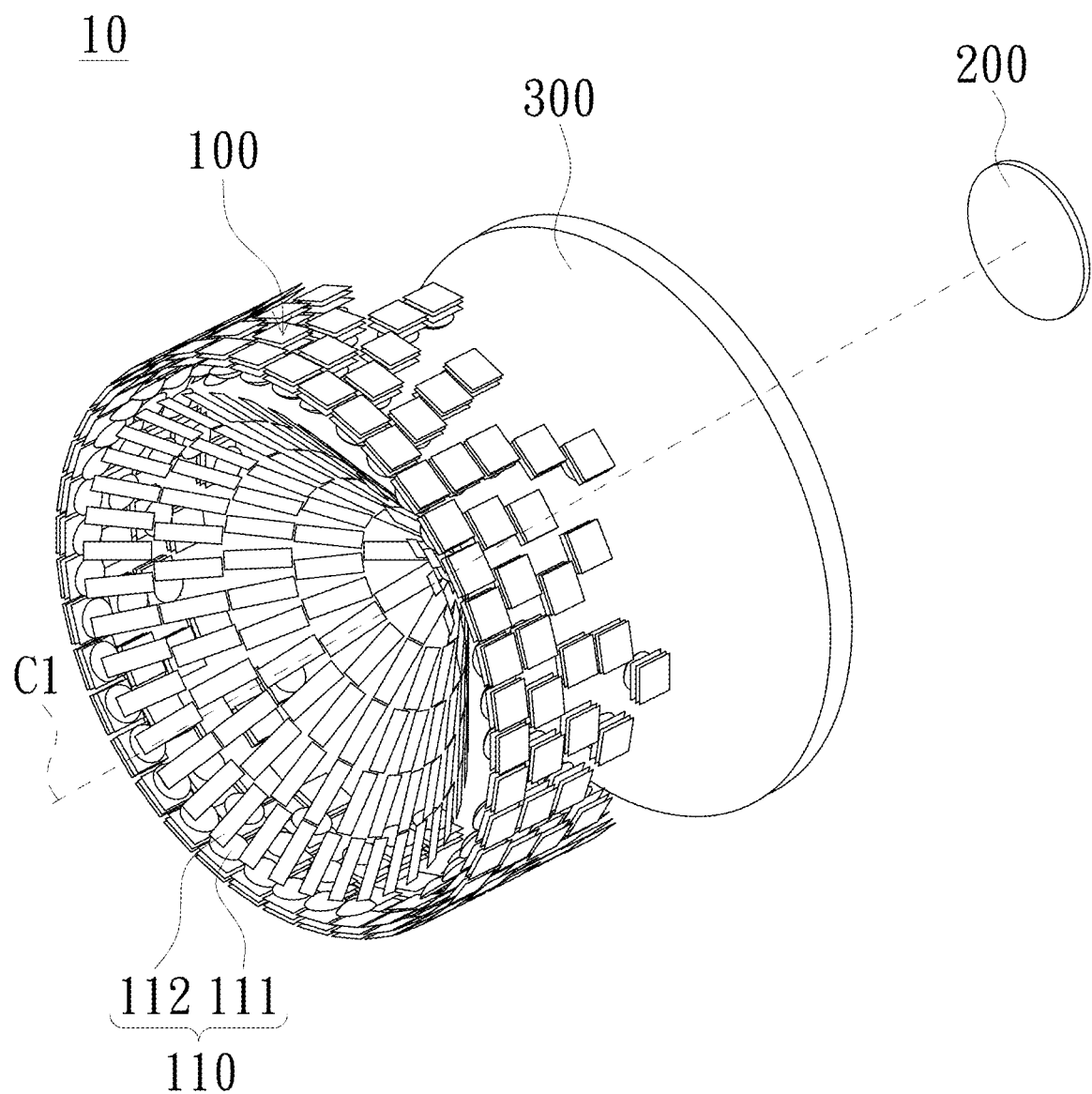
FIG. 1 is a schematic diagram of a light source device according to an embodiment of the invention.
Figure 2:
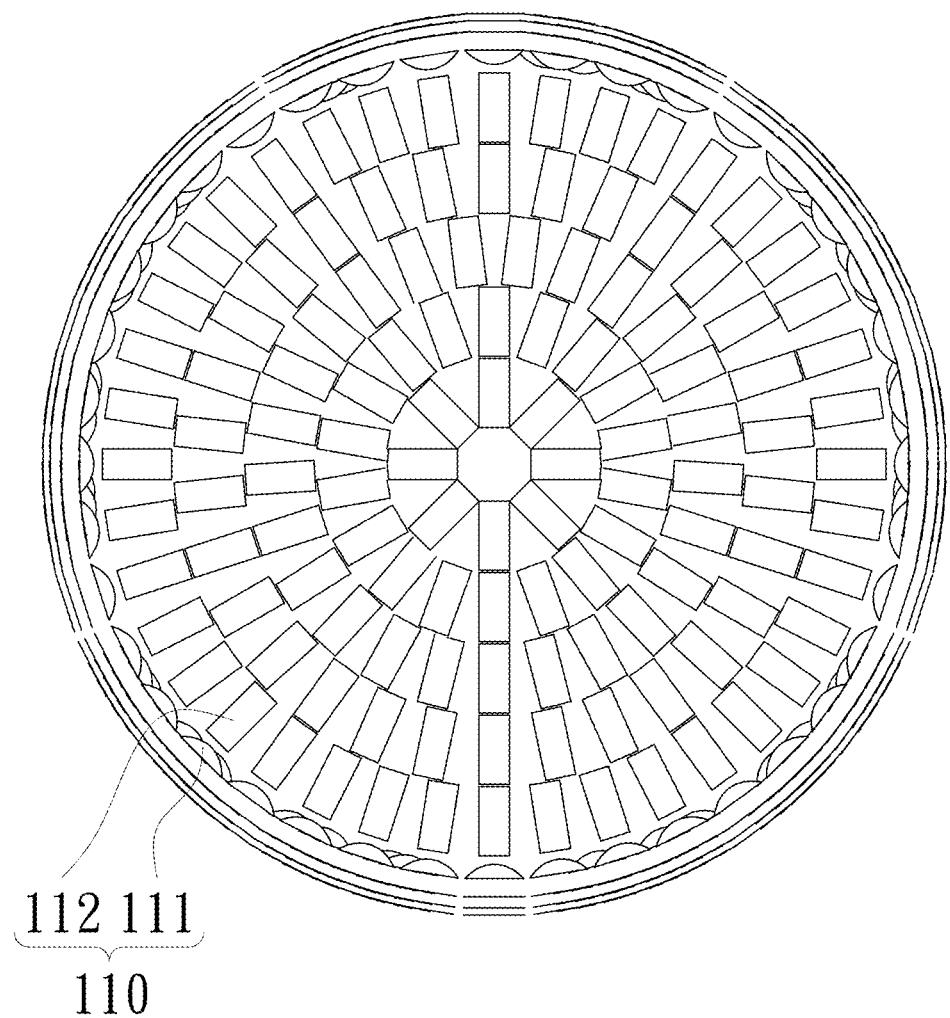
FIG. 2 is a front view of FIG. 1.
Figure 3:
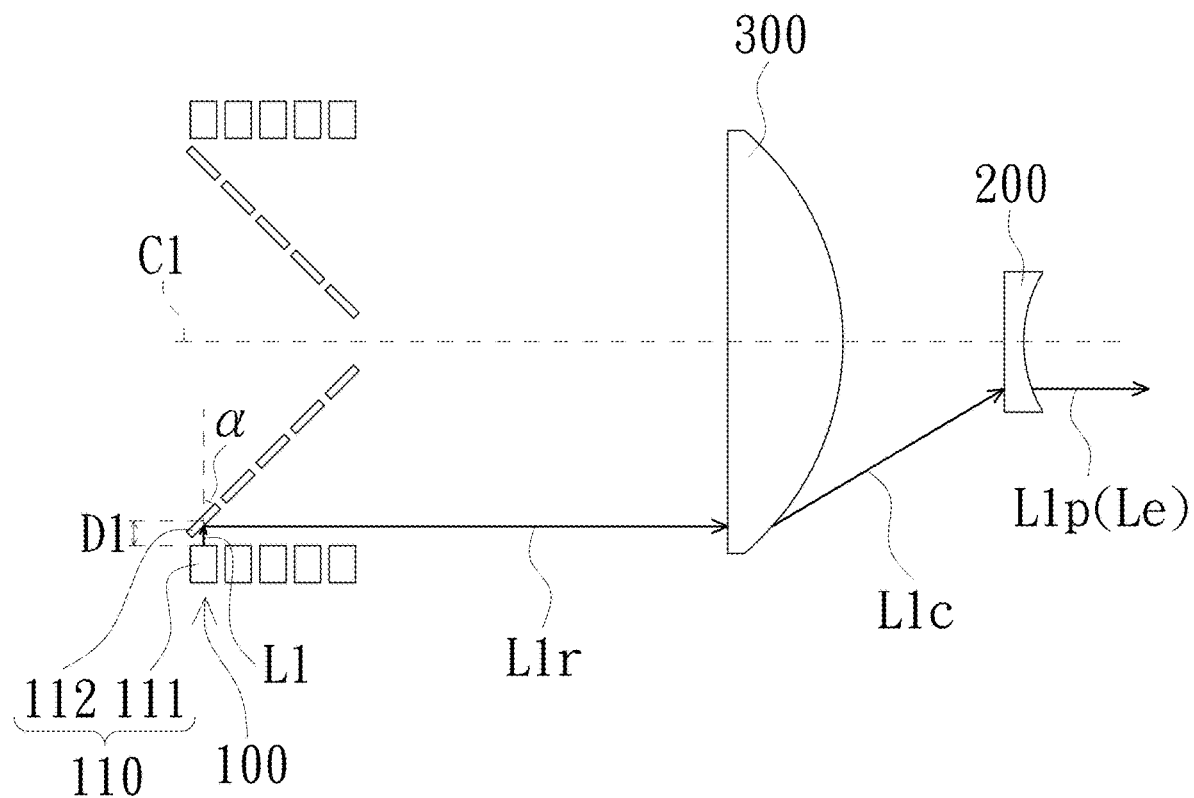
FIG. 3 is another schematic diagram of the light source device shown in FIG. 1.
Figure 4:
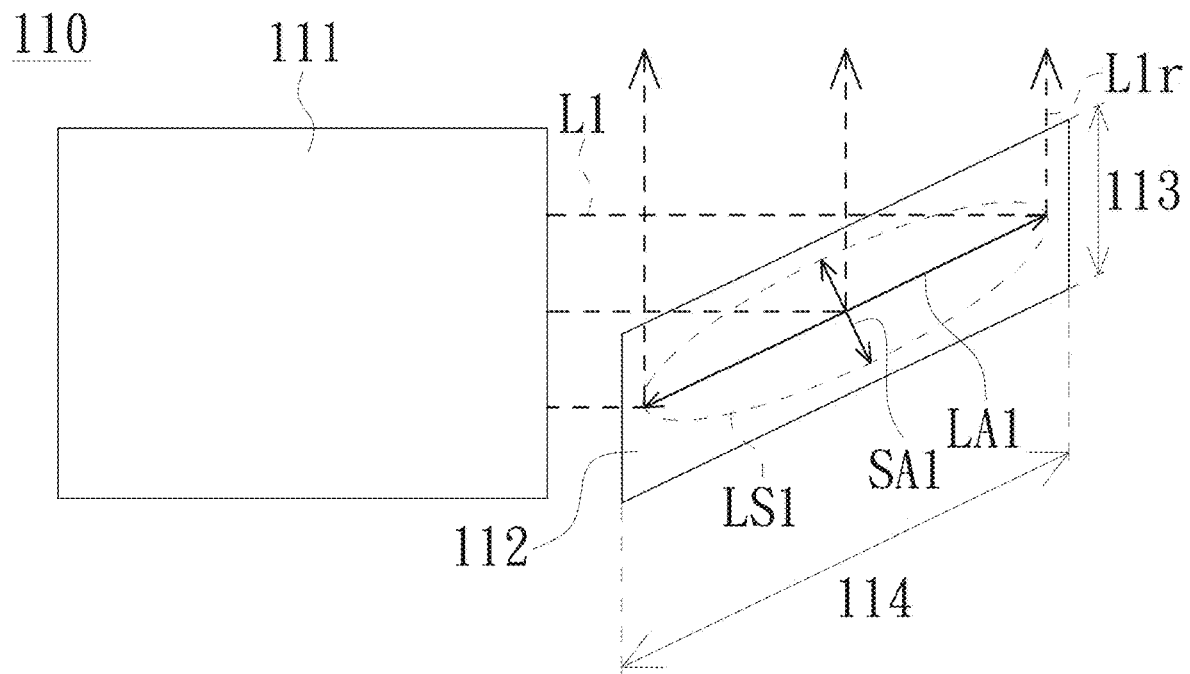
FIG. 4 is a schematic diagram of a first light source set of a first light source assembly in FIG. 1.

FIG. 1 is a schematic diagram of a light source device according to an embodiment of the invention. FIG. 2 is a front view of FIG. 1. FIG. 3 is another schematic diagram of the light source device shown in FIG. 1. FIG. 4 is a schematic diagram of a first light source set of a first light source assembly in FIG. 1. Referring to FIGS. 1 to 4, the light source device 10 of the embodiment includes a first light source assembly 100. The first light source assembly 100 includes a plurality of first light source sets 110. The first light source sets 110 are arranged around a first central axis C1. Each of the first light source sets 110 includes a first excitation light source 111 and a first reflecting element 112. The type of the first excitation light source 111 may be, for example, a blue laser source, but the invention is not limited thereto. The first excitation light source 111 is configured to emit a first excitation light L1. The first reflecting element 112 is disposed between the first excitation light source 111 and the first central axis C1. The first reflecting element 112 is configured to reflect the first excitation light L1 of the first excitation light source 111 to form a laser beam Le. In addition, the light source device 10 may have one or plural first light source assemblies 100, and each of the first light source assemblies 100 may have one or plural first excitation light sources 111. In the embodiment, the number of the first light source assembly 100 is five, the number of the first excitation light source 111 of each of the first light source assemblies 100 is one, and a number of the first reflecting element 112 is one, but the invention is not limited thereto.

In each of the first light source sets 110, an angle α between the reflecting element 112 and a transmission direction of the first excitation light 111 of the first excitation light source 111 may be 45°, and the first central axis C1 may be parallel with a transmission direction of the laser beam Le. In addition, the first reflecting element 112 may have a long axis 114 and a short axis 113 intersecting with the long axis 114. The first excitation light L1 is incident on the first reflecting element 112 and forms a first light spot LS1 on the first reflecting element 112. The first light spot LS1 has a light spot long axis LA1 and a light spot short axis SA1 intersecting with the light spot long axis LA1. The light spot long axis LA1 of the first light spot LS1 may be parallel with the long axis 114 of the first reflecting element 112. The light spot short axis SA1 of the first light spot LS1 may be parallel with the short axis 113 of the reflecting element 112. Further, the first light source sets 110 of each of the first light source assemblies 100 may be arranged around the first central axis C1 at the same distance; for example, the first excitation light sources 111 of the first light source sets 110 of five first light source assemblies 100 may be arranged around the first central axis C1 at the same distance, and the first reflecting elements 112 are planar reflecting elements arranged individually. In the embodiment, the first light spot LS1 formed by the first excitation light L1 on the first reflecting element 112 may be an oval, and the shape of the first reflecting element 112 is rectangle. By arranging the first light source sets 110 of each of the first light source assemblies 100 around the first central axis C1 and the shape of the first reflecting element 112 corresponds to the first light spot LS1, the overall volume of the light source device 10 may be decreased, but the invention is not limited thereto. In other embodiments, the shape of the first reflecting element 112 may be a geometric shape, such as a square, a trapezoid, a triangle, and a circle, or a non-geometric shape.

The light source device 10 may further include a first collimating lens 200 and a first condensing lens 300. The first collimating lens 200 and the first condensing lens 300 are disposed on the first central axis C1. The first condensing lens 300 is disposed between the first collimating lens 200 and the first light source assemblies 100. The first reflecting elements 112 of the first light source sets 110 of the first light source assemblies 100 reflect the first excitation lights L1 from the first excitation light sources 111 and first reflected lights L1r are formed. Transmission directions of the first reflected lights L1r are parallel with the first central axis C1. The first condensing lens 300 is configured to converge the first reflected lights L1r and generate a first condensed light L1c. The first collimating lens 200 is configured to collimate the first condensed light L1c and generate a first collimated light L1p, so as to form the laser beam Le.

Figure 5:
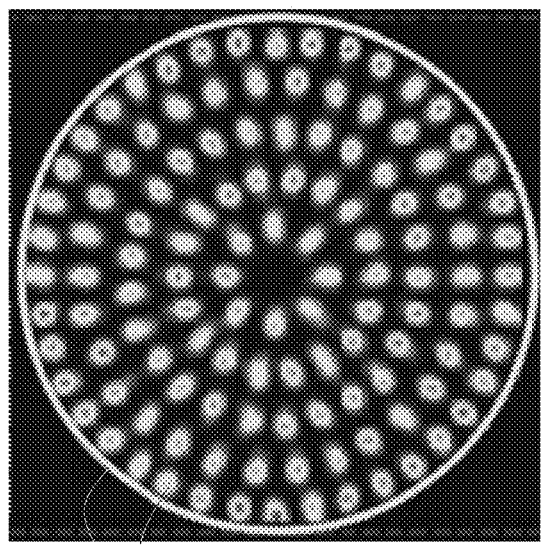
FIG. 5 is a simulation diagram of light spots formed by illuminations of first reflected lights in FIG. 3 on a first condenser lens.

In the light source device 10 of the embodiment, since the first light source sets 110 of each of the first light source assemblies 100 are arranged around the first central axis C1, and each first reflecting element 112 is disposed between the corresponding first excitation light source 111 and the first central axis C1, the arrangement density of the first excitation light sources 111 and the first reflecting elements 112 is increased, and thereby lowering the overall volume of the light source device 10. In addition, FIG. 5 is a simulation diagram of light spots SP1 formed by illuminations of the first reflected lights L1$r$ in FIG. 3 on the first condenser lens 300. Referring to FIGS. 3 and 5, the first reflected lights L1$r$ are formed after the first excitation lights L1 of the first excitation light sources 111 of each of the first light source assemblies 100 are reflected by the corresponding first reflecting elements 112, and the first reflected lights L1$r$ form light spots SP1 on a surface of the first condensing lens 300 facing the first light source assemblies 100. The light spots SP1 are circularly distributed. The light spots SP1 may be distributed from the center portion of the first condensing lens 300 to the peripheral portion of the first condensing lens 300; in this way, the peripheral portion of the first condensing lens 300 may be utilized, and the utilization efficiency of the first condensing lens 300 is improved. Further, by improving the utilization efficiency of the first condensing lens 300, the light intensity of the first condensed light L1$c$ can be increased, and thereby increasing the light intensity of the laser beam Le.

In addition, in the embodiment, the light source device 10 has plural first light source assemblies 100. The first light source assemblies 100 may be arranged along the first central axis C1 toward the transmission direction of the laser beam Le in sequence. A first distance D1 is formed between the first reflecting element 112 and the first excitation light source 111 in each of the first light source sets 110 of each of the first light source assemblies 100. The first distances D1 of the first light source assemblies may increase along the first central axis C1 toward the transmission direction of the laser beam Le; that is, the first distance D1 between the first reflecting element 112 and the first excitation light source 111 in each of the first light source sets 110 of the first light source assembly 100 closest to the first condenser lens 300 is larger than the first distance D1 between the first reflecting element 112 and the first excitation light source 111 in each of the first light source sets 110 of the adjacent first light source assembly 100. Accordingly, a plurality of concentric rings may be formed on the first condensing lens 300 by the light spots generated from the first reflected lights L1$r$ of the first light source assemblies 100, and the concentric rings are arranged on the first condensing lens 300 from the peripheral portion of the first condensing lens 300 to the center portion of the first condensing lens 300 in sequence; thus, the first condensing lens 300 is well-utilized, and the light intensity of the laser beam Le is further increased.

Figure 6:
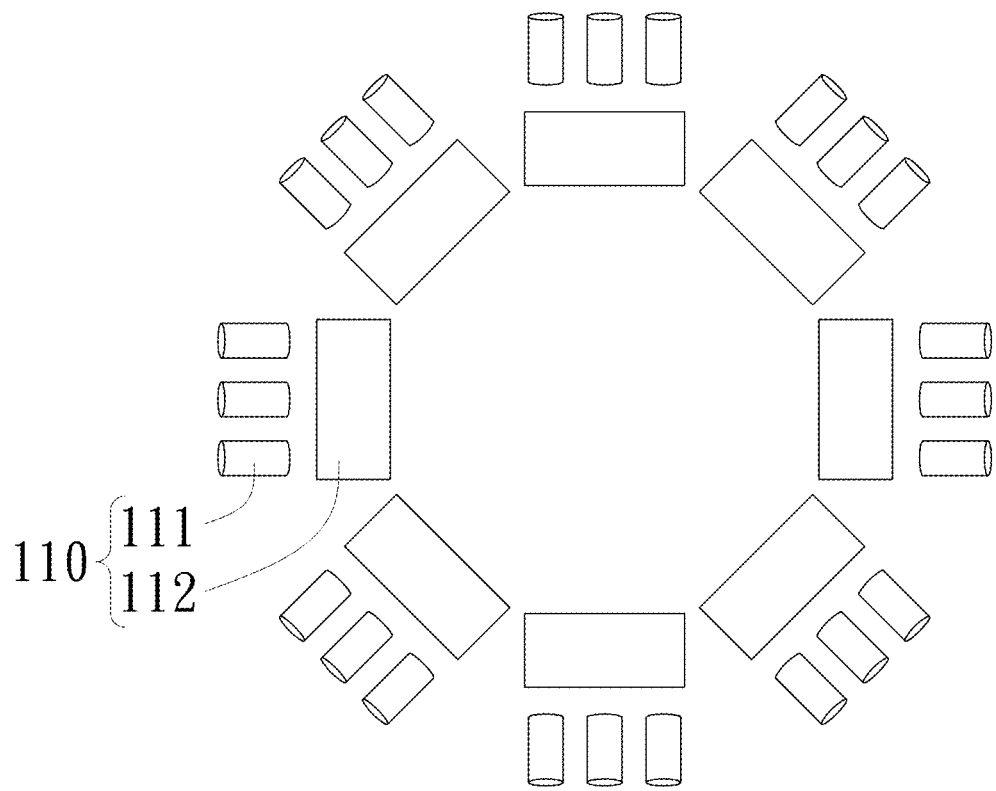
FIG. 6 is a front schematic diagram of a first light source assembly of a light source device according to an embodiment of the invention.
Figure 7:
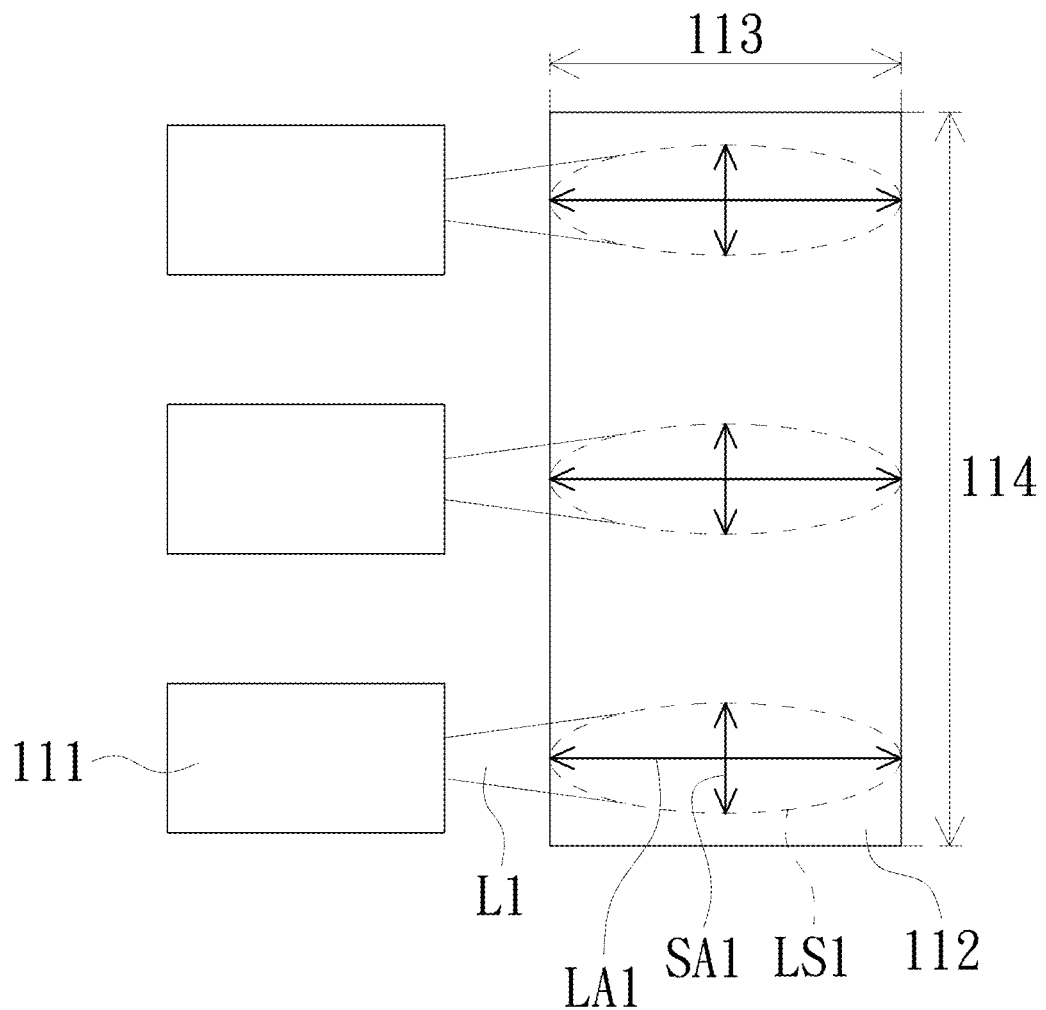
FIG. 7 is a schematic diagram of a first light source set in FIG. 6.

FIG. 6 is a front schematic diagram of a first light source assembly of a light source device according to an embodiment of the invention. FIG. 7 is a schematic diagram of a first light source set in FIG. 6. Referring to FIGS. 6 and 7, in the embodiment, each first light source set 110 of each of the first light source assemblies 100 has plural first excitation light sources 111, and each first light source set 110 has one first reflecting element 112. In this embodiment, the light source set 110 has one reflecting element 112 and three first excitation light sources, but the invention is not limited thereto. The reflecting element 112 has a long axis 114 and a short axis 113 intersecting with the long axis 114. Each first excitation light L1 emitted from the first excitation light sources 111 is incident on the first reflecting element 112 and forms a first light spot LS1 on the first reflecting element 112. The first light spot LS1 has a light spot long axis LA1 and a light spot short axis SA1 intersecting with the light spot long axis LA1. The light spot long axis LA1 of the first light spot LS1 may be parallel with the short axis 113 of the first reflecting element 112. The light spot short axis SA1 of the first light spot LS1 may be parallel with the long axis 113 of the reflecting element 112. In the embodiment, the first light spot LS1 may be oval, and the shape of the first reflecting element 112 is a rectangle, but the invention is not limited thereto.

Figure 8:
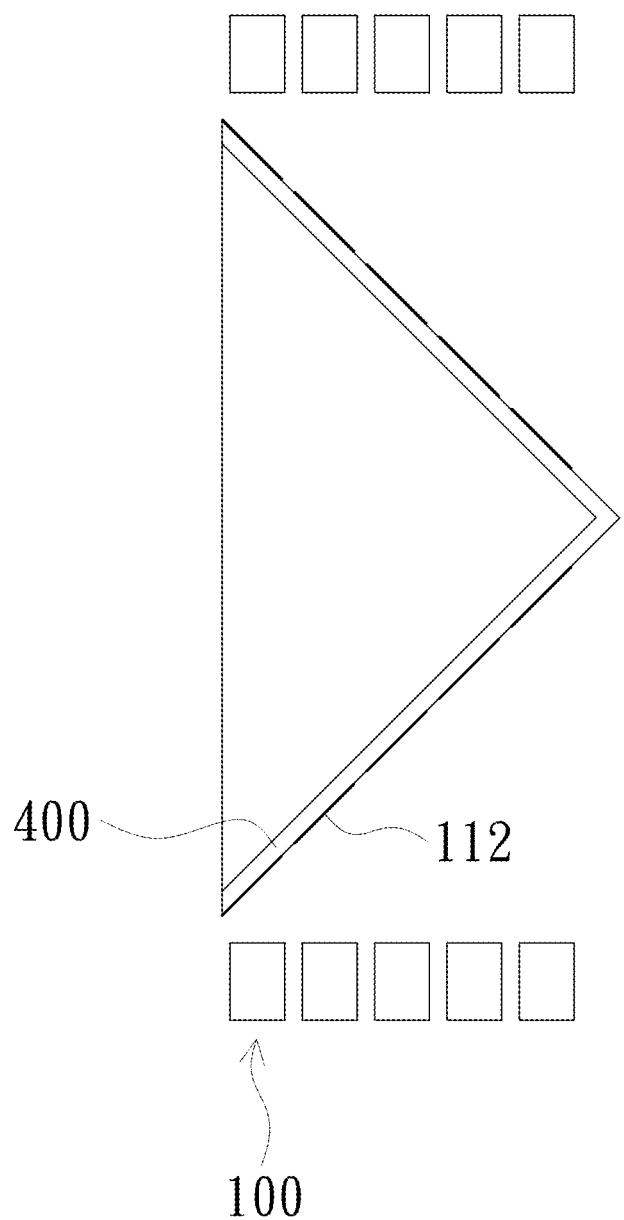
FIG. 8 is a cross-sectional schematic diagram of first light source assemblies of a light source device according to an embodiment of the invention.

FIG. 8 is a cross-sectional schematic diagram of first light source assemblies of a light source device according to an embodiment of the invention. Referring to FIG. 8, the first reflecting elements 112 of the first light source sets of the first light source assemblies 100 are planar regions respectively, and the planar regions are disposed on a conical piece 400.

Figure 9:
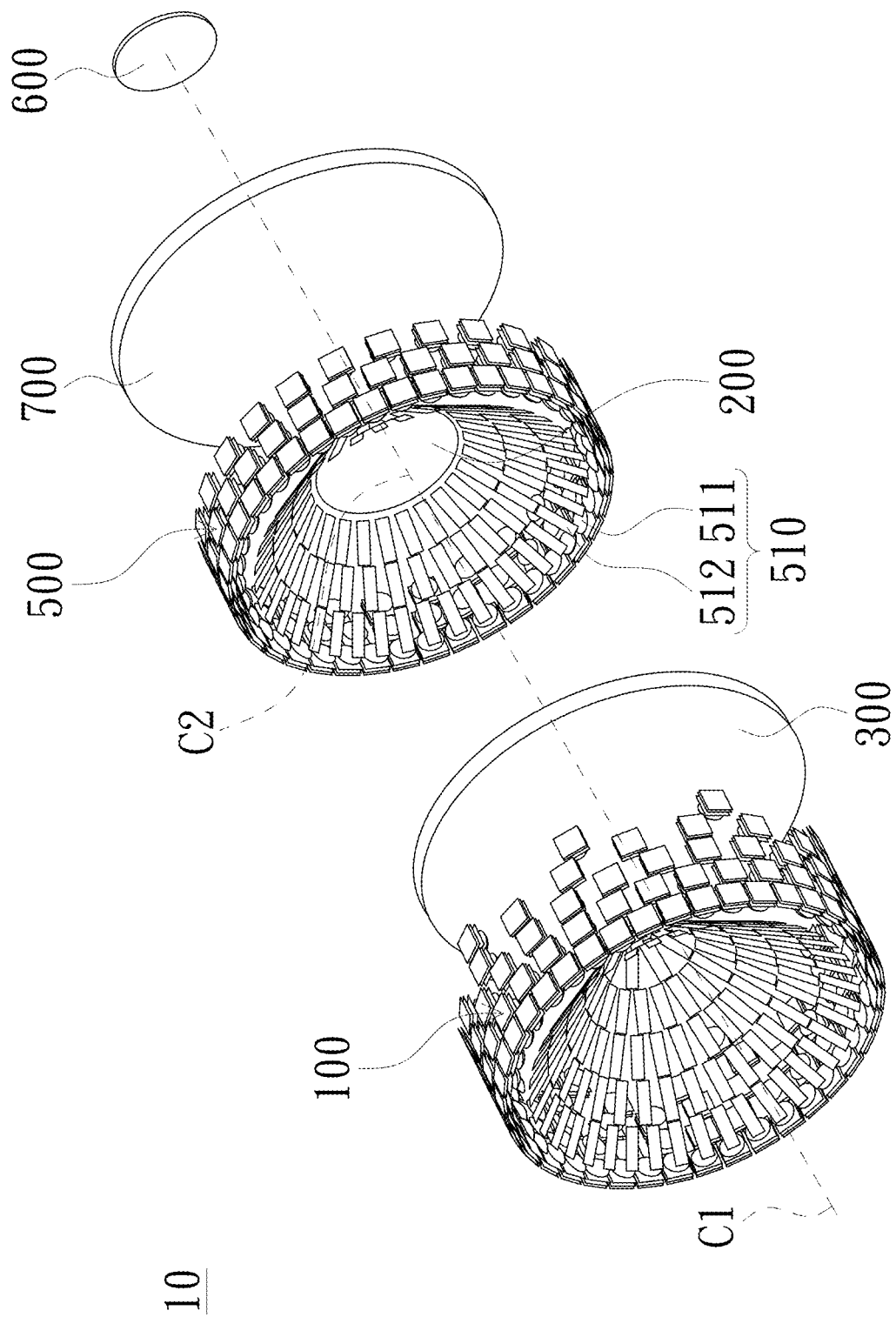
FIG. 9 is a schematic diagram of a light source device according to an embodiment of the invention.
Figure 10:
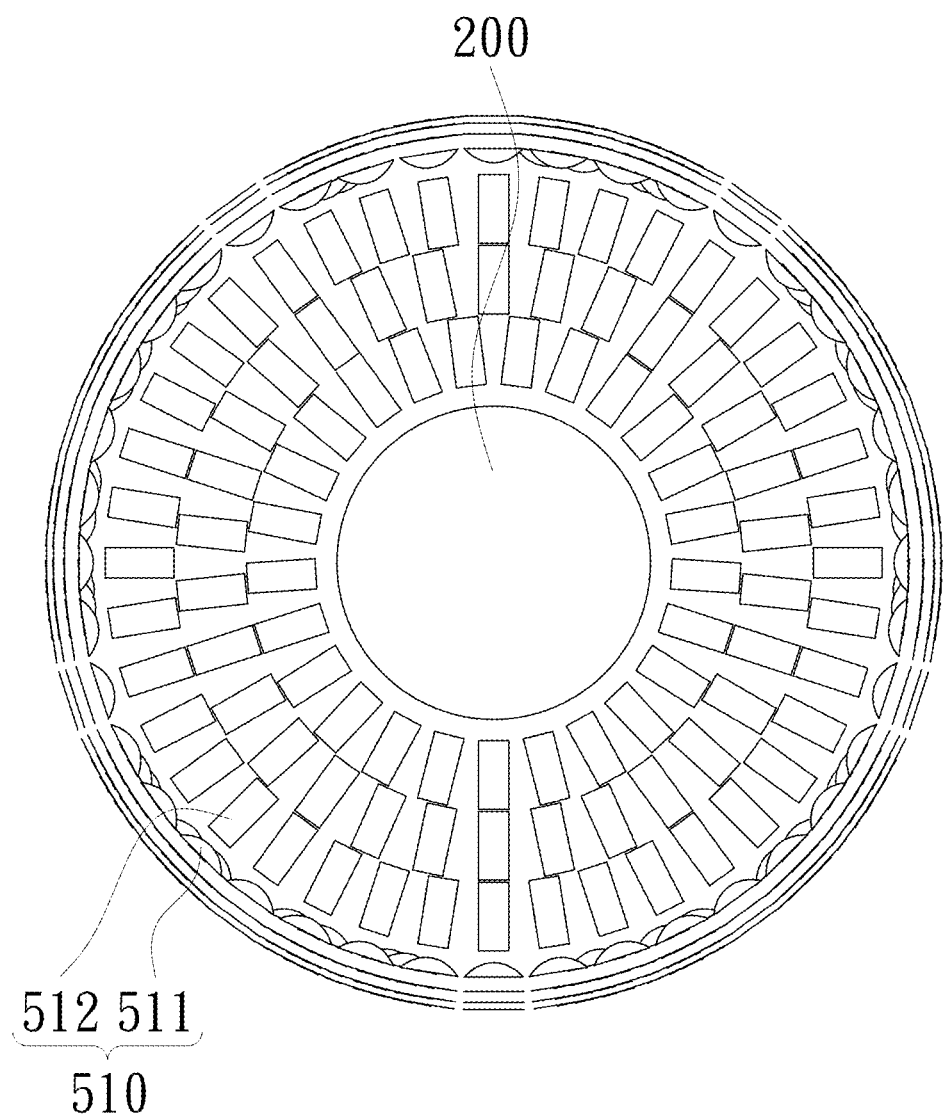
FIG. 10 is a front view of second light source assemblies and a first collimator lens in FIG. 9.
Figure 11:
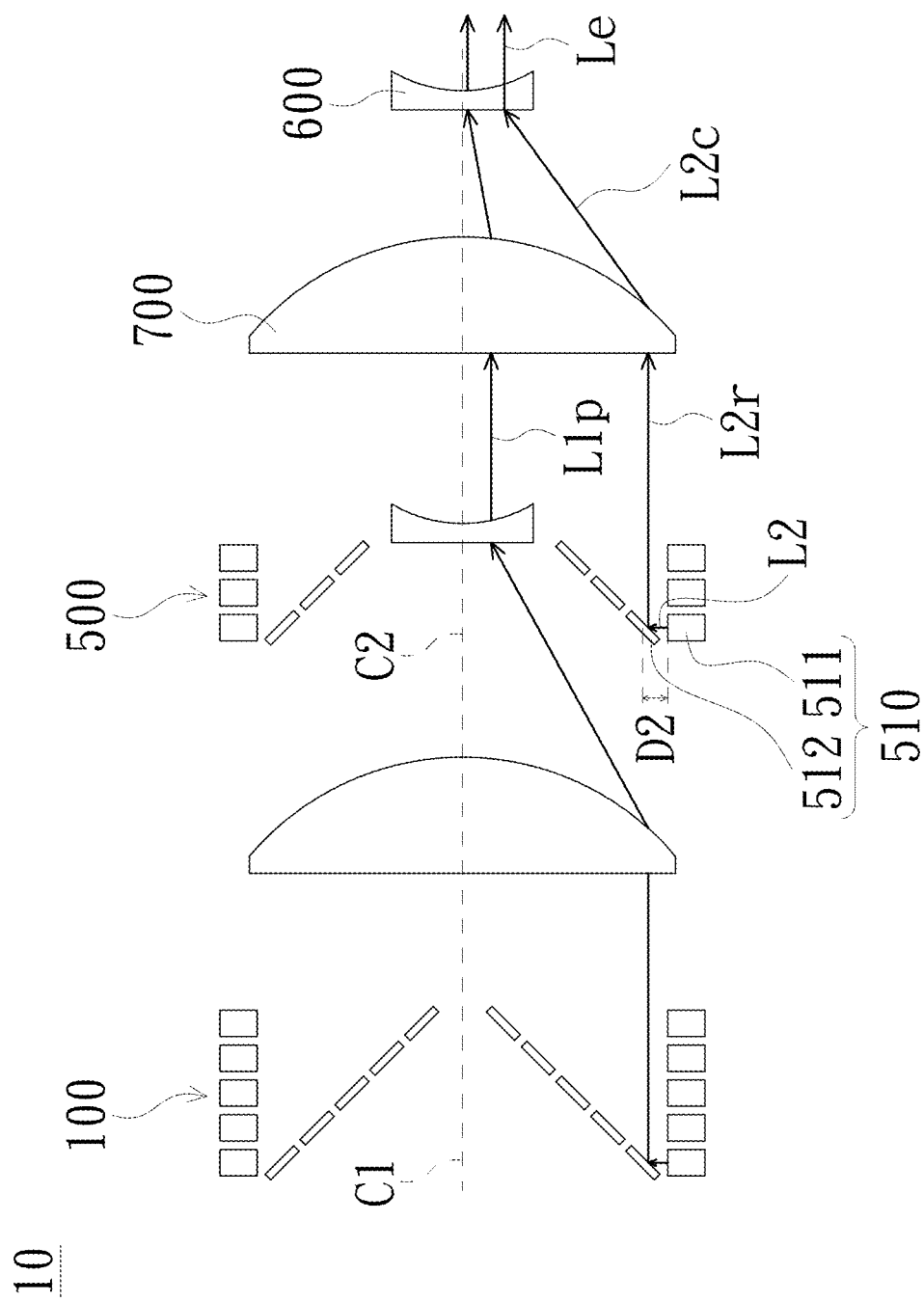
FIG. 11 is another schematic diagram of the light source device shown in FIG. 9.

FIG. 9 is a schematic diagram of a light source device according to an embodiment of the invention. FIG. 10 is a front view of second light source assemblies and a first collimating lens in FIG. 9. FIG. 11 is another schematic diagram of the light source device shown in FIG. 9. Referring to FIGS. 9 to 11, in the embodiment, the light source device 10 may further include a second light source assembly 500. The second light source assembly 500 is adjacent to the first collimating lens 200. The second light source assembly 500 includes a plurality of second light source sets 510. The second light source sets 510 are arranged around a second central axis C2 and surround the first collimator lens 200. Each second light source set 510 includes a second excitation light source 511 and a second reflecting element 512. The second excitation light source 511 is configured to emit a second excitation light L2. The second reflecting element 512 is disposed between the second excitation light source 511 and the second central axis C2, and is configured to reflect the second excitation light L2 emitted from the second excitation light source 511; thereby forming the laser beam Le with the first collimating light L1$p$ generated from the first light source assembly 100. The shape of the second reflecting element 512 may be, for example, a geometric shape of a rectangle, a square, a trapezoid, a triangle, or a circle, or a non-geometric shape. In addition, the light source device 10 has one or plural second light source assemblies 500. Each second light source set 510 has one or plural second excitation light sources 511, and the number of the second light source assembly 500 may be more than or less than the number of the first light source assembly 100. In the embodiment, the number of the second light source assembly 500 is three, the number of the second excitation light source 511 of each of the second light source sets 510 is one, and the number of the first light source assembly 100 is five, but the invention is not limited thereto. Further, the first central axis C1 and the second central axis C2 are connected along the same axial direction. The first collimating lens 200 is disposed on the first central axis C1 and the second central axis C2.

The light source device 10 may further include a second collimating lens 600 and a second condensing lens 700. The second condensing lens 700 is disposed between the second collimating lens 600 and the second light source assemblies 500. The second collimating lens 600 and the second condensing lens 700 are disposed on the second central axis C2. The second reflecting elements 512 of the second light source sets 510 of the second light source assemblies 500 reflect the second excitation lights L2 from the second excitation light sources 511, and thereby forming second reflected lights L2$r$. Transmission directions of the second reflected lights L2$r$ is parallel with the second central axis C2. The second condensing lens 700 is configured to converge the second reflected lights L2r and the first collimated light L1p and generate a second condensed light L2c. The second collimating lens 600 is configured to collimate the second condensed light L2c, so as to form the laser beam Le.

Figure 12:
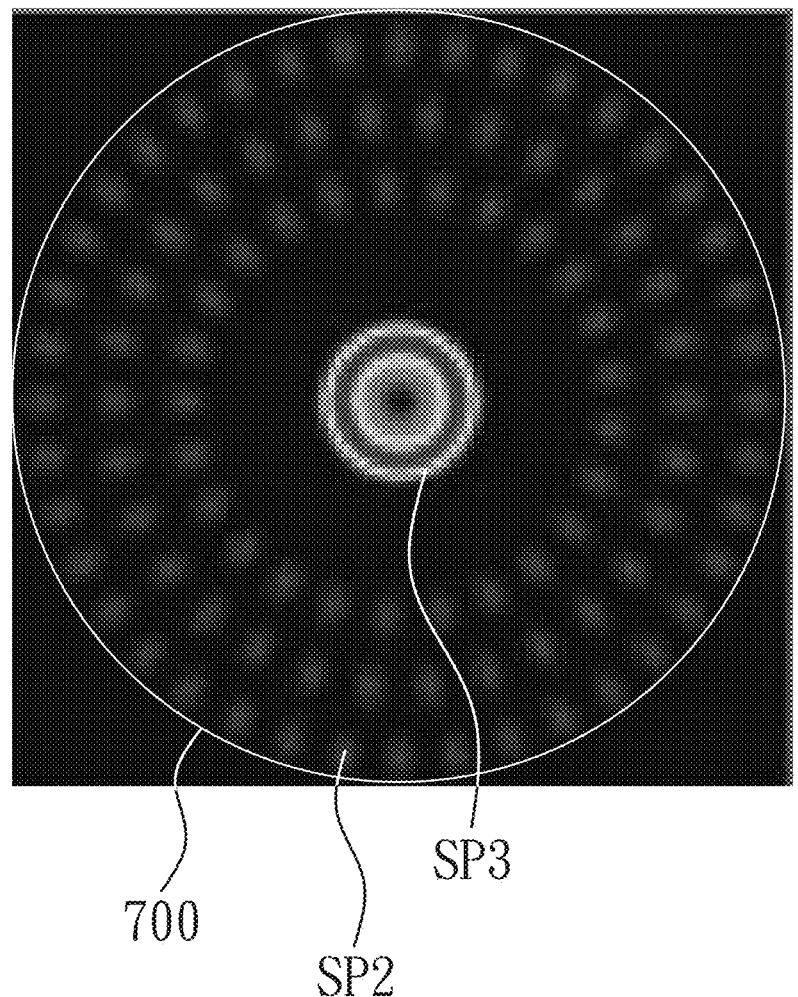
FIG. 12 is a simulation diagram of light spots formed by illuminations of a first collimated light and second reflected lights shown in FIG. 11 on a second condenser lens.

In the light source device 10 of the embodiment, since the second light source sets 510 of each of the second light source assemblies 500 are arranged around the second central axis C2, and the second light reflecting element 512 is disposed between the corresponding second excitation light source 511 and the second central axis 511, the arrangement density of the second excitation light sources 511 and the second reflecting elements 512 is increased, and thereby lowering the overall volume of the light source device 10. In addition, FIG. 12 is a simulation diagram of light spots formed by illuminations of the first collimated light L1p and the second reflected lights L2r on the second condensing lens 700. Referring to FIGS. 11 and 12, the second reflected lights L2r are formed after the second excitation lights L2 of the second excitation light sources 511 of each of the second light source assemblies 500 reflected by the corresponding second reflecting elements 512, and light spots SP2 are formed on the second condensing lens 700 by the second reflected lights L2r. The light spots SP2 are circularly distributed. The light spots SP2 may be positioned on the peripheral portion of the second condensing lens 700, and thus, the peripheral portion of the second condensing lens 700 may be utilized. Meanwhile, since the second light source sets 510 of each of the second light source assemblies 500 surround the first collimating lens 200, light spots SP3 may be formed on the center portion of the second condensing lens 700 by the first collimated light L1p and the center portion of the second condensing lens 700 may be utilized. Therefore, the utilization efficiency of the second condensing lens 700 is improved. Further, by improving the utilization efficiency of the second condensing lens 700, the light intensity of the second condensed light L2c can be increased, and thereby increasing the light intensity of the laser beam Le. In the embodiment, with the configuration of the two ring-shaped light source assemblies, the energy of the laser beam may be concentrated, and thereby achieving the effect of high-density accumulation of the laser beam.

In the embodiment, light source device 10 has plural second light source assemblies 500. The second light source assemblies 500 are arranged along the second central axis C2 toward the transmission direction of the laser beam Le in sequence. In addition, a second distance D2 is formed between the second excitation light source 511 and the second reflecting element 512 in each of the second light source sets 510, and the second distances D2 of the second light source assemblies 510 increase along the second central axis C2 toward the transmission direction of the laser beam Le; that is, the second distance D2 between the second reflecting element 512 and the second excitation light source 511 in each of the second light source sets 510 of the second light source assembly 500 closest to the second condensing lens 700 is larger than the second distance D2 between the second reflecting element 512 and the second excitation light source 511 in each of the second light source sets 510 of the adjacent second light source assembly 500. Accordingly, a plurality of concentric rings may be formed on the second condensing lens 700 by the light spots generated from the second reflected lights L2r of the second light source assemblies 500, and the concentric rings are arranged on the second condensing lens 700 from the peripheral portion of the second condensing lens 700 to the center portion of the second condensing lens 700 in sequence; thus, the second condensing lens 700 is well-utilized, and the light intensity of the laser beam Le is further increased.

Figure 13:
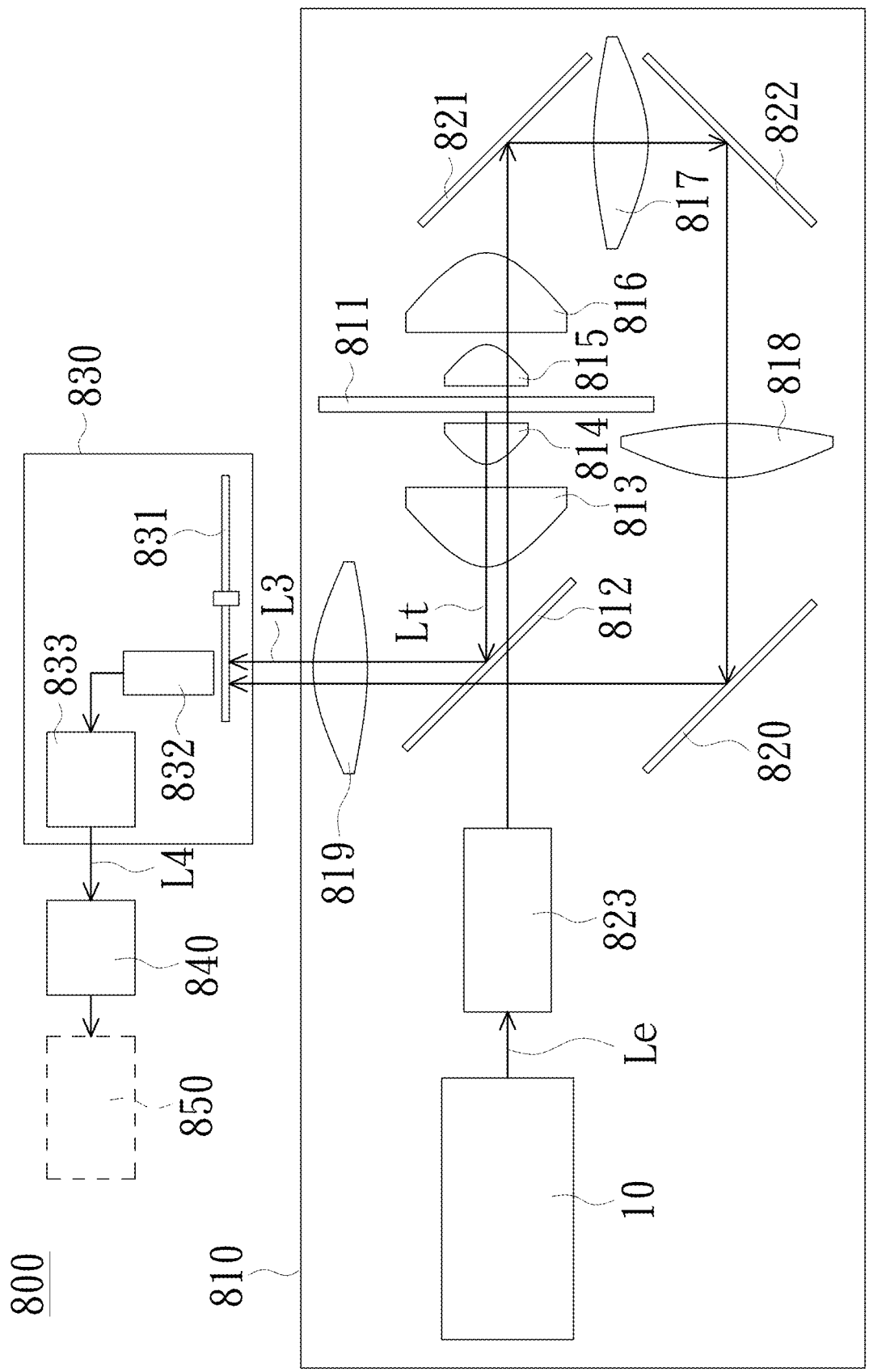
FIG. 13 is a schematic diagram of a projection apparatus according to an embodiment of the invention.

FIG. 13 is a schematic diagram of a projection apparatus according to an embodiment of the invention. Referring to FIGS. 1 and 13, the projection apparatus 800 of the embodiment includes an illumination system 810, an optical engine 830, and a projection lens 840. The illumination system 810 is configured to provide an illuminating beam L3. The optical engine 830 is disposed on a transmission path of the illuminating beam L3 to convert the illuminating beam L3 into an image beam L4. The projection lens 840 is disposed on a transmission path of the image beam L4 to project the image beam onto a screen 850, so as to form an image on the screen 850. The optical engine 830 may include a filter wheel 831, a light homogenizer 832, and a light valve 833. The light homogenizer 832 may be a light integrating rod, but the invention is not limited thereto. The light valve 832 may be a transmissive light valve or a reflective light valve. The transmissive light valve may be a transmissive liquid crystal panel, and the reflective light valve may be a digital micro-mirror device (DMD) or a liquid crystal on silicon (LCOS) panel, but the invention is not limited thereto. The light valve 833 converts illuminating beam L3 passing through the filter wheel 831 and the light homogenizer 832, into the image beam L4. The projection lens 840 may include, for example, one or a combination of a plurality of optical lenses having diopter, such as various combinations of non-planar lenses including biconcave lenses, biconvex lenses, concavo-convex lenses, convexo-concave lenses, plano-convex lenses, and plano-concave lenses. In an embodiment, the projection lens 840 may also include a planar optical lens.

The illumination system 810 includes a light source device 10 and a wavelength-converting wheel 811. The wavelength-converting wheel 811 is disposed on a transmission path of the laser beam Le. The wavelength-converting wheel 811 is configured to convert the laser beam Le into a conversion beam Lt. The illuminating beam L3 comprises the conversion beam Lt. Although FIG. 13 illustrates the light source device 10 in FIG. 1 as an example, the light source device 10 may be replaced with light source device of any one of the above-mentioned embodiments. The specific embodiment of the illumination system 810 will be further described with the drawings in the following, but the specific configuration of the illumination system 810 in the invention is not limited to the embodiment listed below.

In addition to the light source device 10 and the wavelength-converting wheel 811 mentioned above, the illumination system 810 may further include a first color separation sheet 812, a third condensing lens 813, a fourth condensing lens 814, a fifth condensing lens 815, a sixth condensing lens 816, a seventh condensing lens 817, an eighth condensing lens 818, a ninth condensing lens 819, a second color separation sheet 820, a first reflecting sheet 821, and a second reflecting sheet 822. The first color separation sheet 812, the third condensing lens 813, and the fourth condensing lens 814 are disposed between the light source device 10 and the wavelength-converting wheel 811. The fifth condensing lens 815 and the sixth condensing lens 816 are disposed between the wavelength-converting wheel 811 and the first reflecting sheet 821. The seventh condensing lens 817 is disposed between the first reflecting sheet 821 and the second reflecting sheet 822. The eighth condensing lens 818 is disposed between the second reflecting sheet 822 and the second color separation sheet 820. The second color separation sheet 820 and the ninth condensing lens 819 are disposed at two opposite sides of the first color separation sheet 812. The first color separation sheet 812 is configured to allow the laser beam Le to pass through and to reflect the conversion beam Lt. The second separation sheet 820 is configured to reflect the laser beam Le. The laser beam Le passes through the first color separation sheet 812, the third condensing lens 813, and the fourth condensing lens 814, and then is incident on the wavelength-converting wheel 811. The wavelength-converting wheel 811 may have a wavelength-converting area, a light transmission area, and the like. When the wavelength-converting wheel 811 rotates, the wavelength-converting area and the light transmission area may cut into the transmission path of the laser beam Le in turn. The wavelength-converting area includes phosphorescent materials such as fluorescent materials, phosphors, or wavelength conversion materials such as quantum dots. When the laser beam Le is incident on the wavelength-converting area of the wavelength-converting wheel 811, the laser beam Le is converted into the conversion beam Lt. The conversion beam Lt is reflected by a reflecting layer (not depicted) of the wavelength-converting wheel 811, and then is transmitted to the first color separation sheet 812 after passing through the fourth condensing lens 814 and the third condensing lens 813 in sequence. Afterwards, after reflected by the first color separation sheet 812, the conversion beam Lt passes through the ninth condensing lens 819 and is incident on the filter wheel 831. In addition, after the laser beam Le passes through the light transmission area of the wavelength-converting wheel 811, the laser beam Le is incident on the filter wheel 831 after passing through the fifth condensing lens 815, the sixth condenser lens 816, the first reflecting sheet 821, the seventh condensing lens 817, the second reflecting sheet 822, the eighth condensing lens 818, the second color separation sheet 820, the first color separation sheet 812, and the ninth condensing lens 819. Consequently, the illuminating beam L3 provided by the illumination system 810 may include the conversion beam Lt and the laser beam Le.

In addition, the illumination system 810 may further include a light diffuser 823. The light diffuser 823 may be disposed between the first color separation sheet 812 and the light source device 10, and is configured to diffuse the laser beam Le to reduce the energy of the laser beam Le.

In summary, in the light source device and the projection apparatus of the invention, since the first light source sets of the first light source assembly are arranged around the first central axis, the first reflecting element is disposed between the corresponding first excitation light source and the first central axis, and the first excitation lights of the first excitation light sources of the first light source assembly are reflected by the first reflecting elements and the first reflecting lights are formed, the benefits of reducing the volume of the light source device, improving the utilization efficiency of the first condensing lens, and enhancing the intensity of the laser beam are achieved.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first light source assembly, the first light source set, the first reflecting element, the first collimator lens, the first condenser lens, the second light source assembly, the second light source set, the second reflecting element, the second collimator lens, the second condenser lens, the first color separation sheet, the third condenser lens, the fourth condenser lens, the fifth condenser lens, the sixth condenser lens, the seventh condenser lens, the eighth condenser lens, the ninth condenser lens, the second color separation sheet, the first reflecting sheet, the second reflecting sheet, the first axis, the second axis, the first distance, the second distance, the first excitation light, the second excitation light, the first reflected light, the second reflected light, the first condensed light, the second condensed light, the collimated light, the first light spot, are only used for distinguishing various elements and do not limit the number of the elements.

What is claimed is:

1. A light source device, comprising:
at least one first light source assembly, each of the at least one first light source assembly comprising a plurality of first light source sets, the first light source sets arranged around a first central axis, wherein each of the first light source sets comprises at least one first excitation light source and a first reflecting element, the first reflecting element is disposed between the at least one first excitation light source and the first central axis, and a first excitation light of each of the at least one first excitation light source is reflected by the first reflecting element, so as to form a laser beam, wherein the light source device has plural first light source assemblies, the first light source assemblies are arranged along the first central axis toward a transmission direction of the laser beam in sequence, a first distance is formed between the reflecting element and the at least one first excitation light source in each of the first light source sets of each of the first light source assemblies, and the first distances of the first light source assemblies increase along the first central axis toward the transmission direction of the laser beam.

2. The light source device according to claim 1, wherein in each of the first light source sets, an angle between the first reflecting element and a transmission direction of the first excitation light of each of the at least one first exciting light source is 45°, and the first central axis is parallel to the transmission direction of the laser beam.

3. The light source device according to claim 1, wherein the first light source sets of each of the plural first light source assemblies are arranged around the first central axis at the same distance, and the first reflecting element is planar reflecting element.

4. The light source device according to claim 1, wherein each of the first light source sets has one first excitation light source, the first reflecting element has a long axis and a short axis intersecting with the long axis, and a long axis of a first light spot formed by the first excitation light on the first reflecting element is parallel with the long axis of the first reflecting element.

5. A light source device, comprising:
at least one first light source assembly, each of the at least one first light source assembly comprising a plurality of first light source sets, the first light source sets arranged around a first central axis, wherein each of the first light source sets comprises at least one first excitation light source and a first reflecting element, the first reflecting element is disposed between the at least one first excitation light source and the first central axis, and a first excitation light of each of the at least one first excitation light source is reflected by the first reflecting element, so as to form a laser beam, wherein each of the first light source sets has plural first excitation light sources, the first reflecting element has a long axis and a short axis intersecting with the long axis, and a long axis of a first light spot formed by each of the first excitation light on the first reflecting element is parallel with the short axis of the first reflecting element.

6. The light source device according to claim 1, wherein the first reflecting element of each of the first light source sets is disposed on a conical piece.

7. The light source device according to claim 1, wherein the first reflecting element of each of the first light source sets reflects the first excitation light and a plurality of first reflected lights are formed, transmission directions of the first reflected lights are parallel with the first central axis, the light source device further comprises a first collimating lens and a first condensing lens, the first condensing lens is disposed between the first collimating lens and the first light source assemblies, the first condensing lens converges the first reflected lights into a first condensed light, and the first collimating lens collimates the first condensed light into a first collimated light, so as to form the laser beam.

8. The light source device according to claim 7, wherein the light source device further comprises at least one second light source assembly, the at least one second light source assembly is adjacent to the first collimating lens, each of the at least one second light source assembly comprises a plurality of second light source sets, the second light source sets are arranged around a second central axis and surrounds the first collimating lens; and
each of the second light source sets comprises at least one second excitation light source and a second reflecting element, the second reflecting element is disposed between the at least one second excitation light source and the second central axis, and a second excitation light of each of the at least one second excitation light source is reflected by the second reflecting element, so as to form the laser beam with the first collimated light.

9. The light source device according to claim 8, wherein a number of the at least one second light source assembly is less than a number of the at least one first light source assembly.

10. The light source device according to claim 8, wherein the second reflecting element of the second light source sets reflects the second excitation light and a plurality of second reflected lights are formed, transmission directions of the second reflected lights are parallel with the second central axis, the light source device further comprises a second collimating lens and a second condensing lens, the second condensing lens is disposed between the second collimating lens and the at least one second light source assembly, the second condensing lens converges the second reflected lights and the first collimated light into a second condensed light, and the second collimating lens collimates the second condensed light, so as to form the laser beam.

11. The light source device according to claim 8, wherein the light source device has plural second light source assemblies, the second light source assemblies are arranged along the second central axis toward the transmission direction of the laser beam in sequence, a second distance is formed between the second reflecting element and the at least one second excitation light source in each of the second light source sets of each of the second light source assemblies, and the second distances of the second light source assemblies increase along the second central axis toward the transmission direction of the laser beam.

12. The light source device according to claim 8, wherein the first central axis and the second central axis are connected along the same axial direction.

13. A projection apparatus, comprising:
an illumination system, configured to provide an illuminating beam and comprising:
a light source device, comprising at least one first light source assembly, each of the at least one first light source assembly comprising a plurality of first light source sets, the first light source sets arranged around a first central axis, wherein each of the first light source sets comprises at least one first excitation light source and a first reflecting element, the first reflecting element is disposed between the at least one first excitation light source and the first central axis, and a first excitation light of each of the at least one first excitation light source is reflected by the first reflecting element, so as to form a laser beam, wherein the light source device has plural first light source assemblies, the first light source assemblies are arranged along the first central axis toward a transmission direction of the laser beam in sequence, a first distance is formed between the reflecting element and the at least one first excitation light source in each of the first light source sets of each of the first light source assemblies, and the first distances of the first light source assemblies increase along the first central axis toward the transmission direction of the laser beam; and
a wavelength-converting wheel, disposed on a transmission path of the laser beam and converting the laser beam into a conversion beam, wherein the illuminating beam comprises the conversion beam;
an optical engine, disposed on a transmission path of the illuminating beam and converting the illuminating beam into an image beam; and a projection lens, disposed on a transmission path of the image beam.

14. The projection apparatus according to claim 13, wherein the first reflecting element of the first light source sets reflects the first excitation light and a plurality of first reflected lights are formed, transmission directions of the first reflected lights are parallel with the first central axis, the light source device further comprises a first collimating lens and a first condensing lens, the first condensing lens is disposed between the first collimating lens and the first light source assemblies, the first condensing lens converges the first reflected lights into a first condensed light, and the first collimating lens collimates the first condensed light into a first collimated light, so as to form the laser beam.

15. The projection apparatus according to claim 14, wherein the light source device further comprises at least one second light source assembly, the at least one second light source assembly is adjacent to the first collimating lens, each of the at least one second light source assembly comprises a plurality of second light source sets, the second light source sets are arranged around a second central axis and surrounds the first collimating lens; and each of the second light source sets comprises at least one second excitation light source and a second reflecting element, the second reflecting element is disposed between the at least one second excitation light source and the second central axis, and a second excitation light of each of the at least one second excitation light source is reflected by the second reflecting element, so as to form the laser beam with the first collimated light.

16. The projection apparatus according to claim 15, wherein the second reflecting element of the second light source sets reflects the second excitation light and a plurality of second reflected lights are formed, transmission directions of the second reflected lights are parallel with the second central axis, the light source device further comprises a second collimating lens and a second condensing lens, the second condensing lens is disposed between the second collimating lens and the at least one second light source assembly, the second condensing lens converges the second reflected lights and the first collimated light into a second condensed light, and the second collimating lens collimates the second condensed light, so as to form the laser beam.

* * * * *